(12) United States Patent
Harris et al.

(10) Patent No.: US 6,757,177 B2
(45) Date of Patent: Jun. 29, 2004

(54) STACKED BACKPLANE ASSEMBLY

(75) Inventors: Mark Roy Harris, Ottawa (CA); Rodney Stephen Batterton, Ottawa (CA)

(73) Assignee: Tropic Networks Inc., Kanata (CA)

( * ) Notice: Subject to any disclaimer, the term of this patent is extended or adjusted under 35 U.S.C. 154(b) by 233 days.

(21) Appl. No.: 10/062,780

(22) Filed: Feb. 5, 2002

(65) Prior Publication Data

US 2003/0007339 A1 Jan. 9, 2003

Related U.S. Application Data

(60) Provisional application No. 60/302,679, filed on Jul. 5, 2001.

(51) Int. Cl.⁷ ................................................ H05K 1/14
(52) U.S. Cl. ........................ 361/788; 361/790; 361/803
(58) Field of Search ................................ 361/788, 790, 361/803; 439/74, 75

(56) References Cited

U.S. PATENT DOCUMENTS

| | | | | |
|---|---|---|---|---|
| 4,232,924 A | * | 11/1980 | Kline et al. | 439/74 |
| 5,269,693 A | * | 12/1993 | Sekine | 439/74 |
| 5,430,615 A | * | 7/1995 | Keeth et al. | 361/788 |
| 5,617,299 A | | 4/1997 | Knoop et al. | 361/788 |
| 6,154,373 A | * | 11/2000 | Durston et al. | 361/788 |
| 6,238,220 B1 | * | 5/2001 | Hsu | 439/75 |
| 6,388,895 B1 | * | 5/2002 | Hsu | 361/829 |
| 6,390,831 B2 | * | 5/2002 | Shimada et al. | 439/78 |
| 6,483,709 B1 | * | 11/2002 | Layton | 361/724 |
| 6,504,725 B1 | * | 1/2003 | Lam | 361/785 |

FOREIGN PATENT DOCUMENTS

| | | |
|---|---|---|
| EP | 0 929 199 A1 | 7/1999 |
| FR | 1531729 | 7/1968 |

* cited by examiner

Primary Examiner—John B. Vigushin
(74) Attorney, Agent, or Firm—Victoria Donnelly

(57) ABSTRACT

A stacked backplane assembly, including two or more backplanes or midplanes having different functionality and combined together so as to form an integral unit, is provided. The backplanes forming the assembly are manufactured with prime and secondary manufacturing holes to enable alignment, so that the resulting tolerance build-up of the assembly is similar to that of a single backplane. Connectors can be arranged on the backplanes of the assembly so that an electronic or optical card can be simultaneously plugged in to one or more of the backplanes that comprise the stacked backplane assembly. The stacked backplane assembly of the embodiments of the invention is illustrated by having power and signal backplanes and midplanes, but can be equally applied to backplanes that provide other types of functionality.

1 Claim, 6 Drawing Sheets

STACKED BACKPLANE ASSEMBLY

This application claims the benefit of prov. application 60/302,679 filed of Jul. 5, 2001.

FIELD OF THE INVENTION

The invention relates to backplanes used in the electronic and telecommunications industry, and in particular, to a stacked backplane assembly combining two or more backplanes so as to form an integral unit.

BACKGROUND OF THE INVENTION

In the modern electronic industry, backplanes are commonly used when there is a requirement to interconnect several electronic or optical cards according to a required connection scheme. A backplane is an electronic, optical or opto-electronic circuit board into which other circuit boards (cards) can be plugged in.

The requirements for electronic and optical backplanes in high tech industries have become increasingly complex, resulting in a need to combine different functionality on the same backplane or midplane. For example, modern data communications systems operate at high speed on a backplane, at the same time requiring high current levels to supply power to the system. Unfortunately, combining different functionalities on a single backplane, e.g. both high current layout tracks with high-speed tracks, results in difficult and costly manufacturing implications. While the high-speed signals require fine and precise track widths imprinted with thin copper layers to provide the required controlled impedance characteristics of the backplane, the high current tracks are thick and bulky, and require thick copper layers to control heat build-up in the backplane. As a result, such a complicated backplane that provides multiple types of functionality can be manufactured by a limited number of highly specialized suppliers, and typically has a low yield, and hence high cost.

There have been numerous attempts to solve the above-mentioned problem. In one approach, it has been suggested to separate the power function from the signal function on the backplane and run it on a separate buss bar. A buss bar comprises strips of copper, typically laminated together, and connected to the rear side of a backplane. This approach has its drawbacks, as buss bars are expensive and require extra interconnects to route power from the power source to the electronic cards.

In another approach, it has been suggested to route the power on a secondary backplane, which is mounted behind the signal backplane and attached to the signal backplane with mezzanine connectors. The drawback of this approach is that it requires additional space for the whole system, adds the cost of the mezzanine connectors, and makes the whole system bulky and complex.

Accordingly, there is a need in the industry for the development of an alternative structure for multi-functional backplanes used in electronic, telecommunications and other high technology industries, which would avoid the above-mentioned problems.

SUMMARY OF THE INVENTION

It is therefore an object of the invention to provide an improved solution for a multi-functional backplane, which would be simple, cost effective, and easy to manufacture.

According to one aspect of the invention there is provided a stacked backplane assembly, comprising:

at least two backplanes, each backplane having a prime manufacturing reference mark;

the backplanes being assembled so as to form an integral unit in such a manner that the prime manufacturing reference marks of at least two of the backplanes coincide; and at least a portion of each backplane forming the stacked backplane assembly being accessible to an external device.

Preferably, the backplanes comprising the assembly further comprise secondary manufacturing reference marks, and comprise further tertiary manufacturing reference marks, depending on system requirements, the backplanes being assembled such that at least two of the above-mentioned reference marks coincide.

Beneficially, at least one of the prime, secondary and tertiary reference marks is a manufacturing reference hole or a manufacturing reference point, depending on the backplane requirements and system configuration.

Advantageously, one or more of the backplanes comprising the stacked backplane assembly is a midplane, allowing cards to be plugged into the front and rear side of the midplane and into other backplanes comprising the assembly.

Conveniently, each of the backplanes or midplanes comprising the stacked backplane assembly is an electrical, optical or opto-electronic backplane, according to the requirements of the cards to be interconnected.

Conveniently, the stacked backplane assembly comprises two or three backplanes, depending on the system configuration.

Advantageously, not all the backplanes or midplanes comprising the stacked backplane assembly have the same type of functionality, allowing cards to be plugged in to the assembly so that one card is plugged into one or more backplanes simultaneously.

Conveniently, the backplanes comprising the stacked backplane assembly are selected from power backplane, high-speed electrical signal backplane and high-speed optical backplane functionality type.

Advantageously, the backplanes comprising the stacked backplane assembly are assembled so that the rear side of each backplane or midplane faces the front side of the adjacent backplane or midplane, thus forming a backplane sandwich or stacked backplane assembly.

The backplanes or midplanes comprising the stacked backplane assembly may be manufactured so that not all of them have the same size and shape. This allows a stacked backplane assembly to be constructed according to the geometric requirements of specific cards.

Beneficially, backplanes or midplanes comprising the stacked backplane assembly, are manufactured so that the assembly has a uniform thickness, permitting the use of standard cards manufactured in industry. Alternatively, only the portions of the backplanes that are accessible to an external device may conveniently have a uniform thickness.

Advantageously, the stacked backplane assembly comprises two backplanes, where the rear of the first backplane is adjacent to the front of the second backplane, and where the first backplane is a power backplane, and power is supplied to the power backplane from a power cable attached to a terminal block on the rear side of the power backplane, and the power is distributed to the front sides of the first and second backplanes forming the assembly.

The stacked backplane assembly described above has the following advantages. It is much easier and cheaper to manufacture relatively simple individual backplanes and assemble them together into an integral unit than to manufacture a complicated and labour intensive multi-functional backplane. As a result, the stacked backplane assembly forms a compact and reliable unit, which is inexpensive to produce. Conveniently, the backplane assembly as described above permits one or more circuit boards to be plugged into two or more backplanes or midplanes simultaneously, providing a low-cost solution to the problem of routing both power and data communication or telecommunication signals to an electronic or optical card.

BRIEF DESCRIPTION OF THE DRAWINGS

Embodiments of the invention will now be described, by way of example, with reference to the accompanying drawings in which:

FIG. 5b is a side view of the backplane assembly of FIG. 5a; and

DETAILED DESCRIPTION OF THE PREFERRED EMBODIMENTS

Figure 1A:
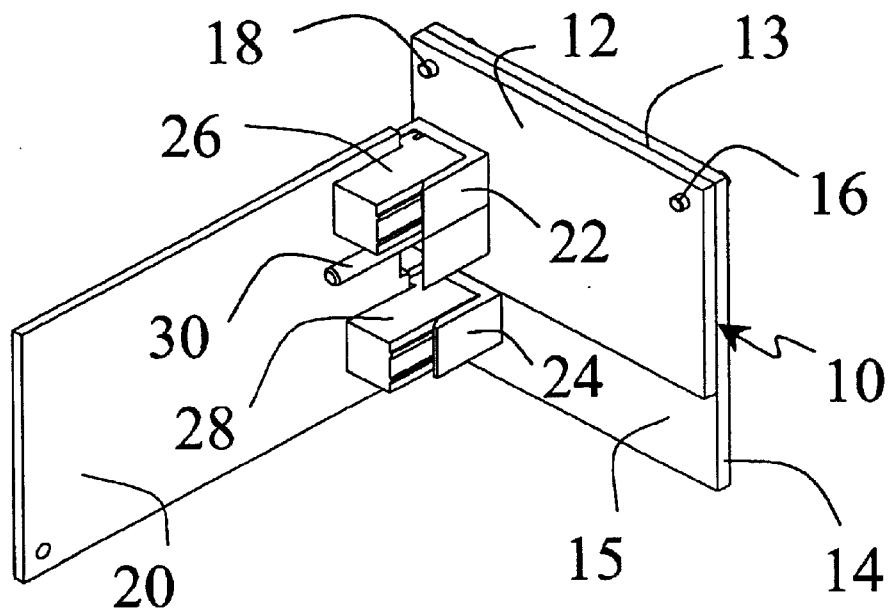
FIGS. 1a and 1b respectively show isometric front and rear views of a stacked backplane assembly according to a first embodiment of the invention.
Figure 1B:
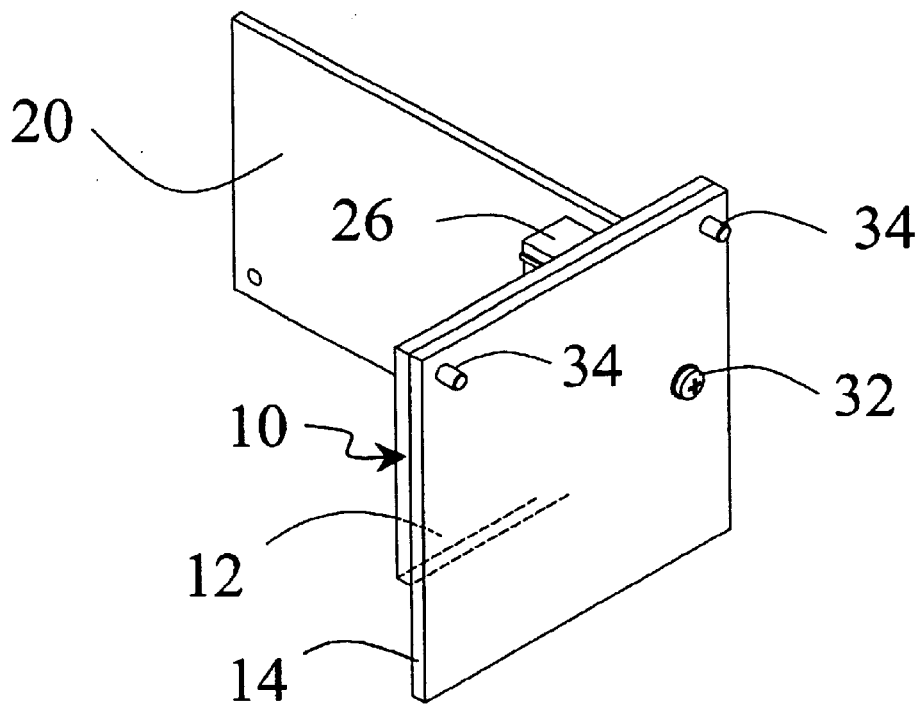

FIGS. 1a and 1b respectively illustrate front and rear isometric views of a stacked backplane assembly 10 according to the first embodiment of the invention. The stacked backplane assembly 10 comprises backplanes of different types of functionality joined together so as to form an integral unit. FIG. 1a illustrates a first backplane 12, the first backplane being a power backplane, and a second backplane 14, the second backplane being a high speed signal backplane, the two backplanes 12 and 14 being joined together so as to form an integral unit.

Each of the backplanes 12 and 14 has prime and a secondary reference manufacturing marks 16 and 18 respectively, and the marks are implemented as prime and secondary manufacturing holes, as shown in FIG. 1a. The prime manufacturing hole 16 is used during the manufacturing process for each backplane as a datum reference. It is typically a tightly toleranced hole of about 0.125" diameter, and is used to align the backplanes comprising the stacked backplane assembly, and also as a reference for drilled holes in each backplane.

The backplanes 12 and 14 are combined together in such a manner that the rear side 13 of the first backplane 12 faces the front side 15 of the second backplane 14. To assemble the backplanes, a spring pin 34 is inserted into the prime manufacturing hole 16 on the backplane 12, then the second backplane 14 is aligned by eyesight on the pin, and the backplanes joined together. The same process is used to align the secondary manufacturing hole 18 on the backplanes 12 and 14. In addition, one of the backplanes has a slot that is used to compensate for any tolerance build-up between the primary and secondary holes on the backplanes (not shown). Finally, the backplanes are fastened together with a screw 32, using an alignment pin 30.

The backplanes forming the stacked backplane assembly are also combined together in such a manner that each of the backplanes has a portion that is accessible to an external device, e.g. to an electronic card 20 having blind mate connectors 26 and 28 to be plugged in to connectors 22 and 24 on the backplanes. A connector 22 on the power backplane 12 attaches to a blind mate power connector 26 on the printed circuit board 20, and a connector 24 on the signal backplane 14 attaches to a blind mate signal connector 28 on the printed circuit board 20.

Thus, the printed circuit board 20 connects to both the power backplane 12 and the signal backplane 14 simultaneously, and consequently the stacked backplane assembly 10 provides a low-cost solution to the problem of routing both power and data communication or telecommunication signals to an electronic card. The connectors 22, 24, 26, 28 used in the stacked backplane assembly 10 are capable of compensating for any tolerance build-up between the connector positions on each backplane. A typical connector system accommodates a tolerance build-up of approximately 0.010", this being the clearance between the plug and receptacle of the connector pair. The stacked backplane assembly 10 provides an alignment tolerance similar to that of a single backplane, being approximately +/−0.003". Thus, a standard connector system can be chosen for the stacked backplane assembly due to the capability to accommodate the level of alignment tolerance expected for a single backplane.

Figure 2A:
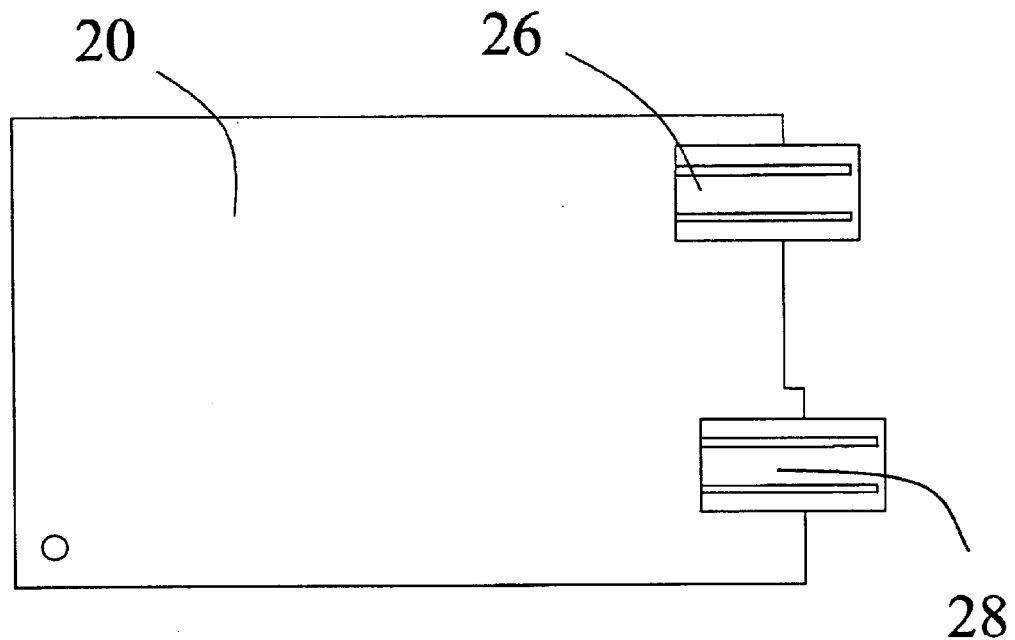
FIGS. 2a and 2b show electronic cards with a staggered profile and with a regular profile respectively to be connected to the stacked backplane assembly of FIGS. 1a and 1b.
Figure 2B:
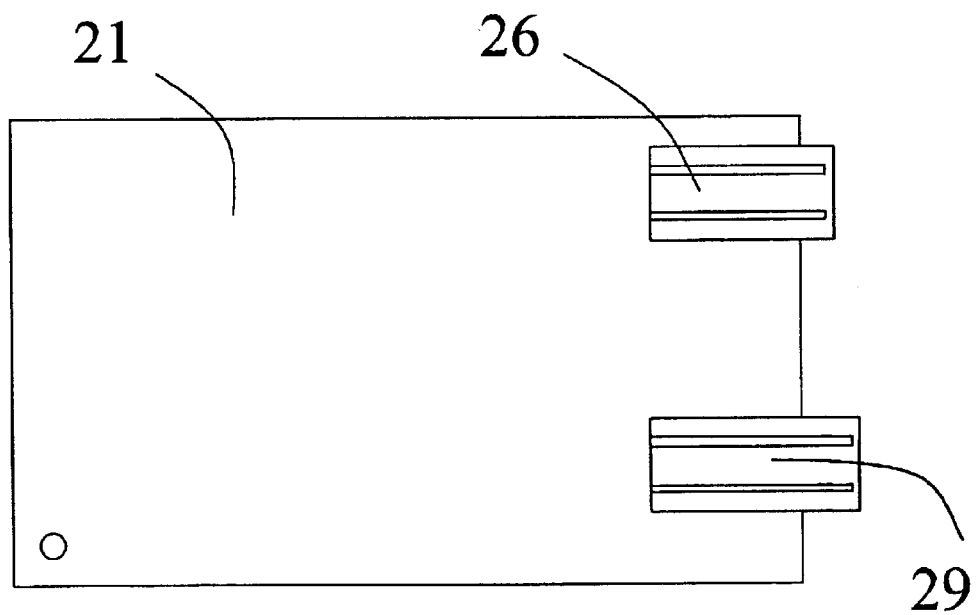

By way of example, FIG. 2a illustrates a side view of an electronic card 20 manufactured for use with the stacked backplane assembly 10. The blind mate connectors 26 and 28 on the card 20 are offset vertically, forming a staggered profile of the card 20, such that each connector on the card 20 plugs into the corresponding connector 22 and 24 of the stacked backplane assembly 10 simultaneously. Alternatively, as illustrated in FIG. 2b, a regular shaped card 21 without the staggered profile can be used if the card 21 has an elongated connector 29 or an extension device to the connector 28 (not shown) such that when the connector assembly is attached to a regular shaped card 21, the connectors 26 and 29 provide the necessary staggered profile for use with the stacked backplane assembly 10.

Thus, the stacked backplane assembly, including several individual backplanes that have different types of functionality and are assembled as an integral unit with a required degree of tolerance, is provided.

Figure 3A:
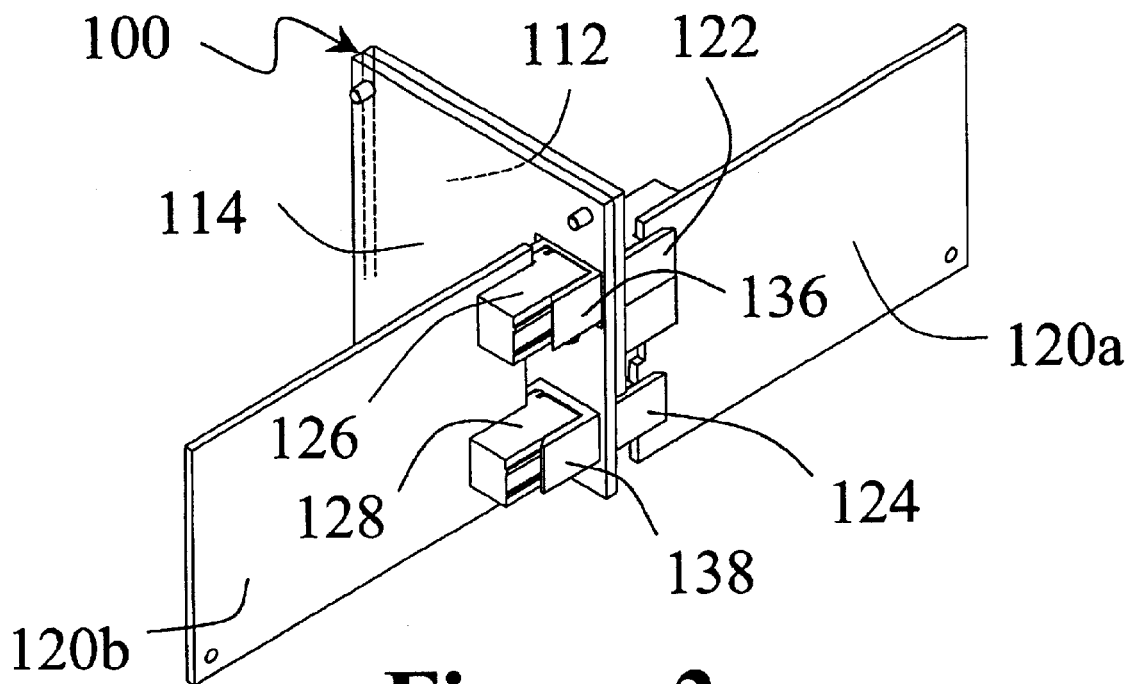
FIGS. 3a and 3b respectively show isometric front and rear views of the stacked backplane assembly according to a second embodiment of the invention.
Figure 3B:
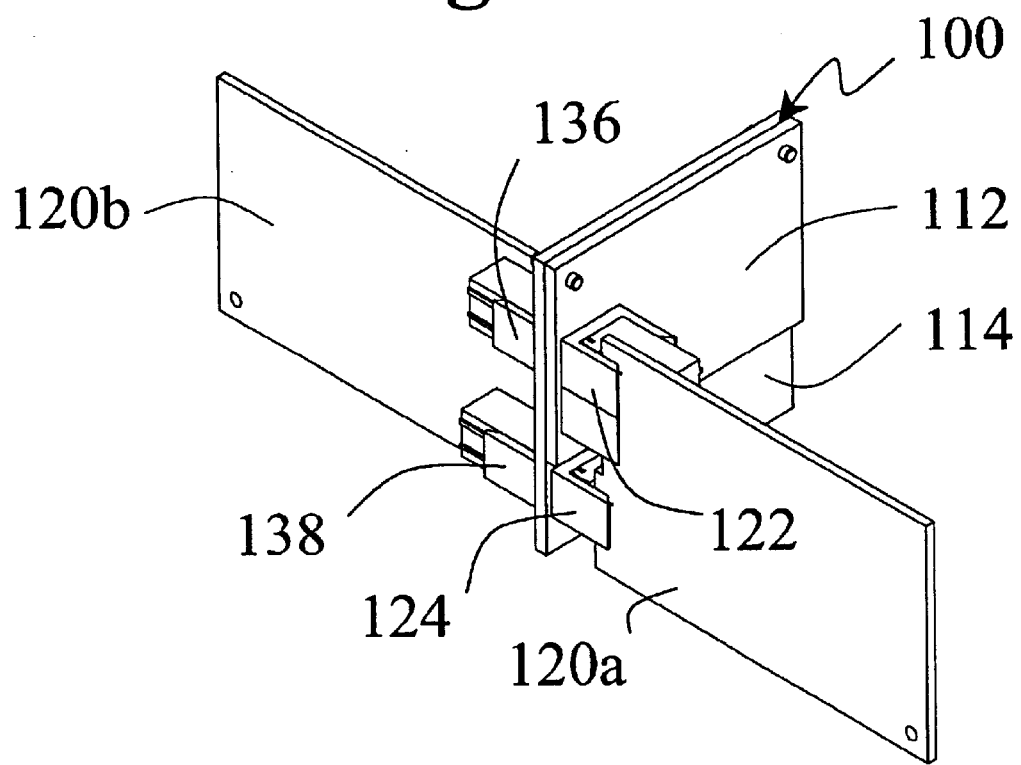

FIGS. 3a and 3b illustrate the stacked backplane assembly 100 of the second embodiment of the invention. The stacked backplane assembly 100 is similar to that of the first embodiment shown in FIGS. 1a and 1b, except for the stacked backplane assembly 100 comprising two midplanes 112 and 114 instead of the backplanes. A midplane is an electronic circuit board, containing sockets or connectors on both sides, into which other circuit boards (cards) can be plugged in. Similar elements in FIGS. 1a and 1b and FIGS. 3a and 3b are designated by the same reference numerals incremented by 100. FIG. 3a illustrates the front view of a stacked backplane assembly 100 comprising a signal midplane 114 joined together with a power midplane 112 so as to form an integral unit. FIG. 3b illustrates a rear view of the same assembly. For the purpose of illustration, printed circuit boards 120 are plugged into both sides of the stacked backplane (midplane) assembly. The signal midplane 114 carries connectors 124 and 138, and the power midplane 112 carries connectors 122 and 136, the connectors being on opposite sides of the backplane (midplane) assembly as shown in FIGS. 3a and 3b. The signal midplane 114 has a rectangular hole such that, when joined with the power midplane 112, the connector 136 protrudes through the signal midplane 114, allowing the blind mate connectors 126 and 128 on the printed circuit board 120b to be plugged into the connector 136 on the power midplane 112, and plugged into the connector 138 and signal midplane 114, respectively. Another printed circuit board 120a can also be plugged into the signal midplane 114 and power midplane 112 simultaneously, using connectors 122 and 124, respectively.

Thus, the stacked backplane assembly of the second embodiment provides a means for several individual midplanes that have different types of functionality to be assembled as an integral unit and with the required degree of tolerance.

Figure 4:
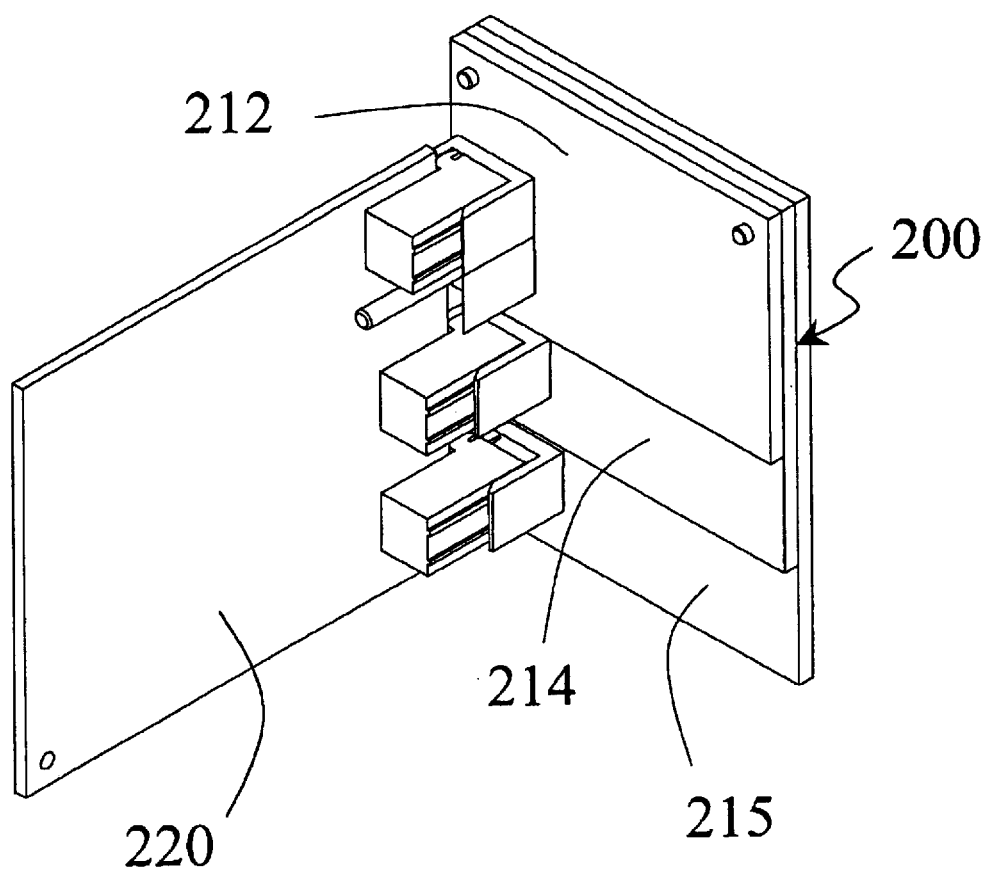
FIG. 4 is an isometric front view of the stacked backplane assembly according to a third embodiment of the invention.

FIG. 4 illustrates the stacked backplane assembly 200 of the third embodiment of the invention. The stacked backplane assembly 200 is similar to that of the first embodiment shown in FIGS. 1a and 1b, except that the stacked backplane assembly 200 comprises now three backplanes instead of two backplanes in the first embodiment. Similar elements in FIGS. 1a and 1b and FIG. 4 are designated by the same reference numerals incremented by 200. In this embodiment, the stacked backplane assembly 200 comprises a power backplane 212 joined together with a high-speed signal backplane 214 and a low-speed signal backplane 215 to form an integral unit in such a manner that prime and secondary manufacturing reference points for all three backplanes coincide and provide the required degree of alignment. As an illustration, a printed circuit board 220 is plugged in to the stacked backplane assembly 200, providing power distribution as well as the capability to receive signals from different backplanes. Also, this embodiment permits cards to be plugged into two or three backplanes in varying combinations, providing the capability for printed circuit boards 220 of various requirements to be interconnected a simultaneously.

Figure 5A:
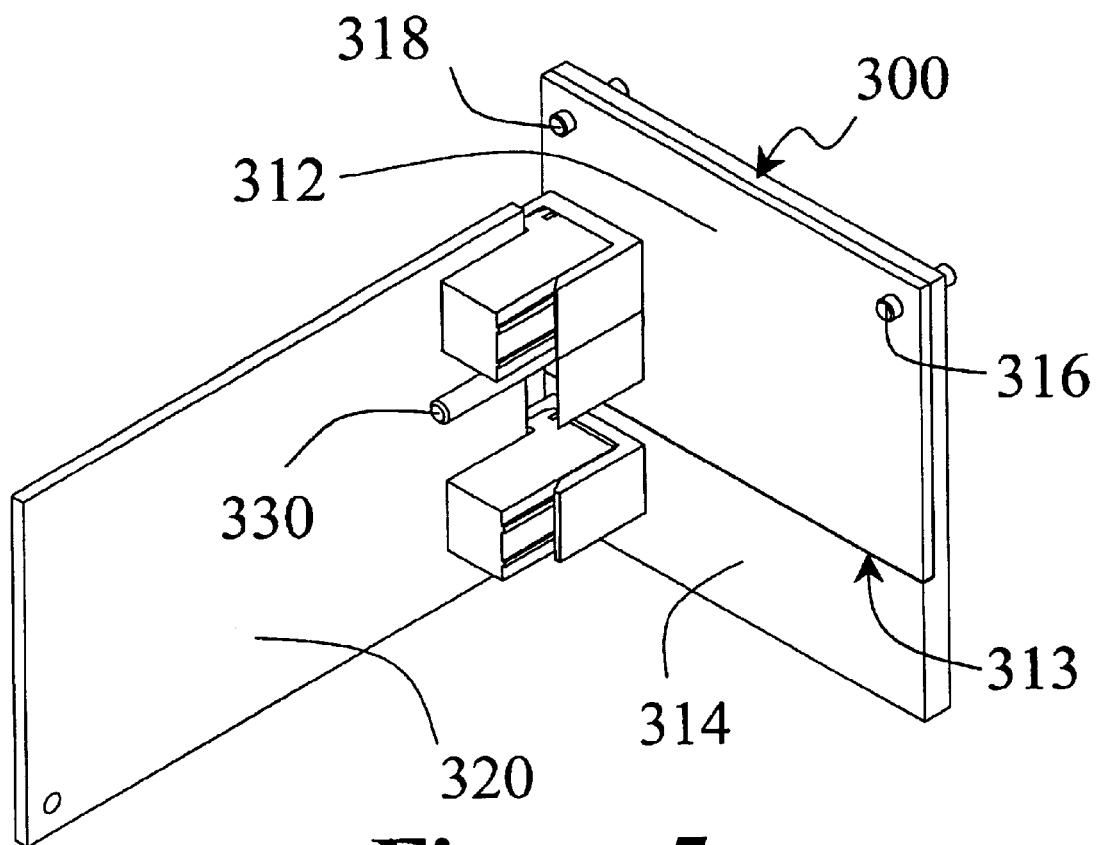
FIG. 5a is an isometric front view of the stacked backplane assembly according to a fourth embodiment of the invention.
Figure 5B:
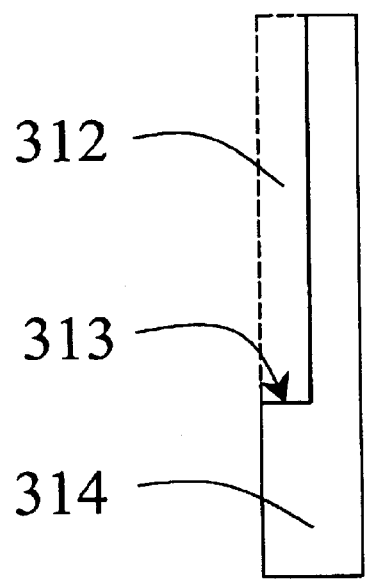

FIGS. 5a and 5b illustrate the stacked backplane assembly 300 of the fourth embodiment of the invention. The stacked backplane assembly 300 is similar to that of the first embodiment shown in FIGS. 1a and 1b, except the stacked backplane assembly 300 has now a uniform thickness. Similar elements in FIGS. 1a and 1b and FIGS. 5a and 5b are designated by the same reference numerals incremented by 300. In this embodiment, the signal backplane 314 is manufactured with a recess 313 of such a shape that, when joined together with the power backplane 312 to form an integral unit, the stacked backplane assembly 300 has a uniform thickness (FIG. 5b). This embodiment provides the capability for a printed circuit board 320 to be manufactured without the need for vertically offset blind mate connectors, an example of which is illustrated in FIG. 5a.

Figure 6A:
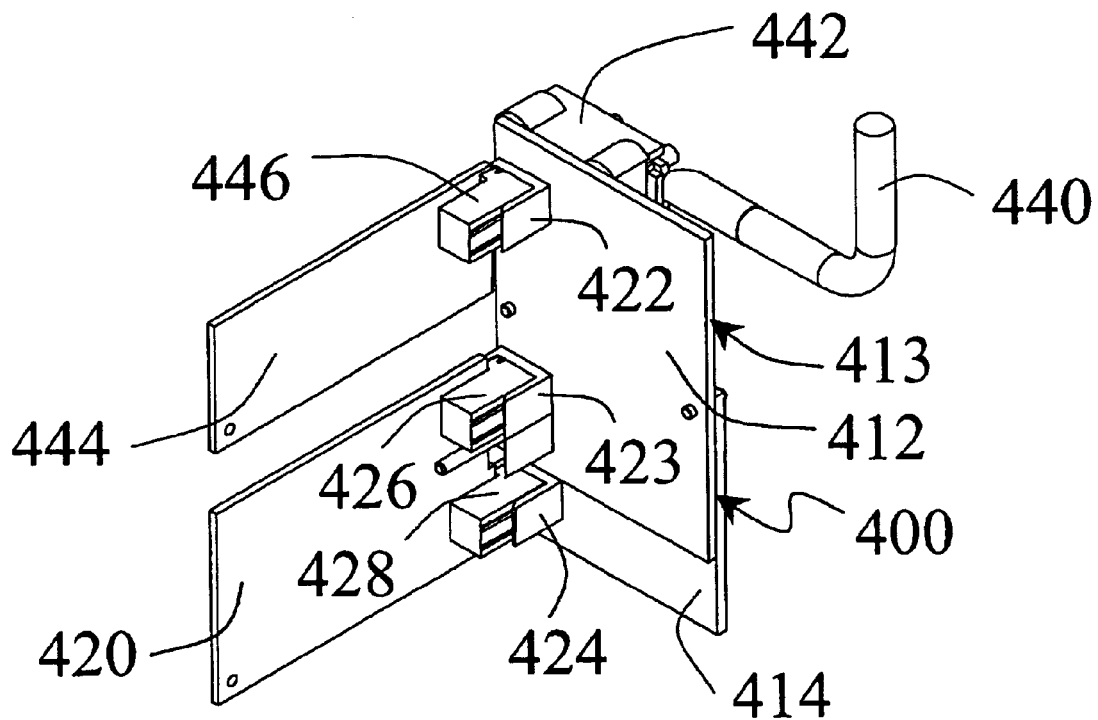
FIGS. 6a and 6b respectively show isometric front and rear views of the stacked backplane assembly according to a fifth embodiment of the invention.
Figure 6B:
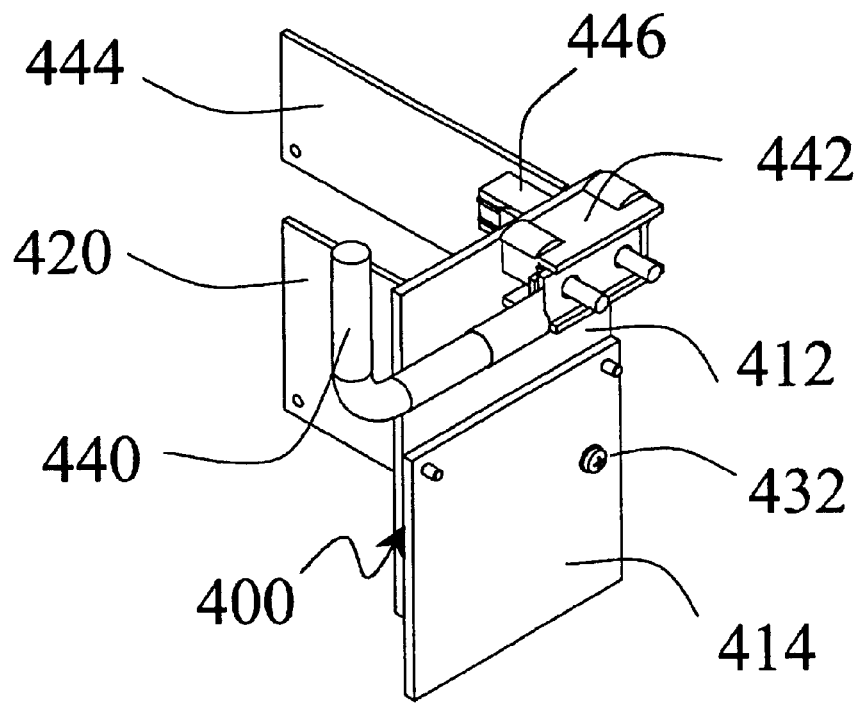

FIGS. 6a and 6b illustrate the stacked backplane assembly 400 of the fifth embodiment of the invention. The stacked backplane assembly 400 is similar to that of the first embodiment shown in FIGS. 1a and 1b, except the power backplane 412 is manufactured with a terminal block 442 attached to the rear side 413 of the backplane 412 that receives a power cable 440. Similar elements in FIGS. 1a and 1b and FIGS. 6a and 6b are designated by same reference numerals incremented by 400. The power from the terminal block 442 is routed to a connector 422 on the front side of the power backplane 412, providing the capability to plug in a replaceable power circuit board 444 that can route power to a breaker switch (not shown), perform power conditioning, and re-route power back through connectors 446, 422 to the power backplane 412, and then can be routed back to another printed circuit board 420 through connectors 426 and 423.

It is contemplated that modifications to the embodiments described above may include three or more backplanes to be joined together to form an integral unit. The stacked backplane assembly can be modified so as to comprise a mixture of backplanes having different types of functionality, e.g. power and signal backplanes, or power backplanes with different capabilities, or signal backplanes of different capabilities.

In a further modification to the above embodiments, the stacked backplane assembly may include backplanes of different sizes and shapes, permitting the interconnection of cards of various configurations. Conveniently, two or more stacked backplanes of different shapes and sizes can be assembled so that, while the portions of the stacked backplane assembly to which the connectors are attached have a uniform thickness, other portions of the stacked backplane assembly may not have a uniform thickness.

Alternatively, the stacked backplane assembly of the embodiments described above can be modified to comprise backplanes and midplanes in various combinations, which provide different types of functionality.

In yet a further modification to these embodiments, the stacked backplane assembly may use a tertiary manufacturing reference mark for corresponding alignment of the backplanes and/or midplanes forming the assembly.

The stacked backplane assembly described above has the following advantages. It is much easier and cheaper to manufacture relatively simple individual backplanes and assemble them together into an integral unit than to manufacture a complicated and labour intensive multi-functional backplane. As a result, the stacked backplane assembly forms a compact and reliable unit, which is inexpensive to produce. Conveniently, the backplane assembly as described above permits one or more of circuit boards to be plugged into two or more backplanes or midplanes simultaneously, providing a low-cost solution to the problem of routing both power and data communication or telecommunication signals to an electronic or optical card.

Although specific embodiments of the invention have been described in detail, it will be apparent to one skilled in the art that variations and modifications to the embodiments may be made within the scope of the following claims.

What is claimed is:

1. A stacked backplane assembly comprising:
    a first and second backplane, each backplane having a front side and rear side, and a prime manufacturing reference mark;
    the backplanes being assembled to form an integral unit in such a manner that the prime manufacturing reference marks of the backplanes coincide, and the rear side of the first backplane is facing the front side of the second backplane;
    at least a portion of each backplane forming the stacked backplane assembly being accessible to an external device; and
    the first backplane being a power backplane, wherein power is supplied to the rear side of the power backplane and distributed to the front sides of the first and second backplane.

* * * * *